US012785678B2

(12) United States Patent
Agrawal

(10) Patent No.: US 12,785,678 B2
(45) Date of Patent: Nov. 3, 2026

(54) IMPEDANCE DESIGN IN A RESONANT SWITCH

(71) Applicant: Shaoxing Yuanfang Semiconductor Co., Ltd., Shaoxing (CN)

(72) Inventor: Gaurav Agrawal, Bangalore (IN)

(73) Assignee: Ningbo Aura Semiconductor Co., Ltd, Ningbo (CN)

( * ) Notice: Subject to any disclaimer, the term of this patent is extended or adjusted under 35 U.S.C. 154(b) by 293 days.

(21) Appl. No.: 18/399,782

(22) Filed: Dec. 29, 2023

(65) Prior Publication Data

US 2024/0364330 A1 Oct. 31, 2024

(30) Foreign Application Priority Data

Apr. 26, 2023 (IN) ............................ 202341030083

(51) Int. Cl.
*H03K 17/687* (2006.01)

(52) U.S. Cl.
CPC ................................ *H03K 17/6871* (2013.01)

(58) Field of Classification Search
CPC ................................................ H03K 17/6871
USPC ......................................................... 327/427
See application file for complete search history.

(56) References Cited

U.S. PATENT DOCUMENTS 5,822,684 A 10/1998 Kitakubo
9,484,977 B2 11/2016 Anderson et al.
10,840,952 B2 11/2020 Dai
10,911,040 B2 2/2021 Atesal et al.
2007/0002781 A1 1/2007 Yoon et al.
(Continued)

FOREIGN PATENT DOCUMENTS

CN 108988876 A 12/2018
JP H08298404 A 11/1996
(Continued)

OTHER PUBLICATIONS

K. Kawakyu, Y. Ikeda, et al, A novel resonant-type GaAs SPDT switch IC with low distortion characteristics for 1.9 GHz personal handy-phone system, IEEE MTT-S International Microwave Symposium Digest, Jun. 17, 1996, pp. 647-650, IEEE.
(Continued)

*Primary Examiner* — Tomi Skibinski
(74) *Attorney, Agent, or Firm* — IPHORIZONS PLLC; Narendra Reddy Thappeta

(57) ABSTRACT

A three-port resonant switch includes multiple switching elements coupled in series between a first port and a second port of the resonant switch. Each switching element has a parasitic capacitance across it, and a resistance in the ON-state. The multiple switching elements include a first set and a second set of switching elements. The first set of switching elements and the second set of switching elements are connected in series at a junction. The resonant switch further includes a capacitor connected between the junction and a constant reference potential. In an embodiment, the resonant switch is used in a transceiver, and the three ports are respectively connected to a termination resistor, an antenna via a circulator and a low-noise amplifier of a receiver in the transceiver. The resonant switch has good isolation between the first port and third port and low insertion-loss between the first port and the second port.

20 Claims, 4 Drawing Sheets

(56) References Cited

U.S. PATENT DOCUMENTS

| | | | |
|---|---|---|---|
| 2014/0139298 | A1 | 5/2014 | Kim et al. |
| 2016/0182037 | A1 | 6/2016 | Srihari et al. |

FOREIGN PATENT DOCUMENTS

| | | | | |
|---|---|---|---|---|
| WO | WO2022067855 | A1 | 4/2022 | |
| WO | WO-2023022901 | A1 * | 2/2023 | ........... H03K 17/693 |

OTHER PUBLICATIONS

W. B. Kuhn, M. M. Mojarradi and A. Moussessian, "A resonant switch for LNA protection in watt-level CMOS transceivers," in IEEE Transactions on Microwave Theory and Techniques, vol. 53, No. 9, pp. 2819-2825, Sep. 2005.

* cited by examiner

IMPEDANCE DESIGN IN A RESONANT SWITCH

PRIORITY CLAIM

The instant patent application is related to and claims priority from the co-pending India provisional patent application entitled, "IMPROVING ISOLATION AND INSERTION LOSS IN RF SWITCH", Serial No.: 202341030083, Filed: 26 Apr. 2023, which is incorporated in its entirety herewith to the extent not inconsistent with the description herein.

BACKGROUND

Technical Field

Embodiments of the present disclosure relate generally to electronic switches, and more specifically to impedance design in a resonant switch.

Related Art

A switch is operable to either block or pass-through an input signal from one port of the switch to another port, as is well known in the relevant arts. A resonant switch contains additional impedances to shape either the voltage or the current waveform of the input signal passing through the resonant switch, which ensures that the input signal is passed through with minimal distortion. Generally, at least some of the impedances operate at resonance with respect to the frequency band of the input signal under corresponding operation conditions (e.g., transmission or reception of the input signal by a device using the switch), and hence the switch is termed a 'resonant switch'.

Additionally, the impedances (or at least some of them) may also serve the purpose of impedance-transformation or impedance-matching, for example, to ensure that when the resonant switch is used in a larger circuit/device the impedance at a port due to an external circuit is transformed to a desired value when viewed from another port. Such transformation or matching may be for the purpose of minimizing transmission-line reflections and consequent distortion and/or attenuation of the signal(s) passing through the switch from one port to another.

Resonant switches find use in blocks such as RF (Radio Frequency) transceivers.

Aspects of the present disclosure are directed to design of such impedances in resonant switches.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A resonant switch provided according to an aspect of the present disclosure contains three ports (a first port, a second port and a third port) and includes multiple switching elements coupled in series between a first port and a second port of the resonant switch. Each switching element has a parasitic capacitance across it, and a resistance in the ON-state. The multiple switching elements include a first set of switching elements and a second set of switching elements. The first set of switching elements and the second set of switching elements are connected in series at a junction. The resonant switch further includes a capacitor connected between the junction and a constant reference potential.

In an embodiment, the resonant switch (switch) is used in a transceiver, and the first port, the second port and the third port are respectively connected to a termination resistor, an antenna (via a circulator) and a low-noise amplifier (LNA) of a receiver in the transceiver. The connection of the capacitor at the junction of the first set of switching elements and the second set of switching elements improves the isolation between the first port and the third port, and also reduces the insertion-loss between the first port and the second port.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
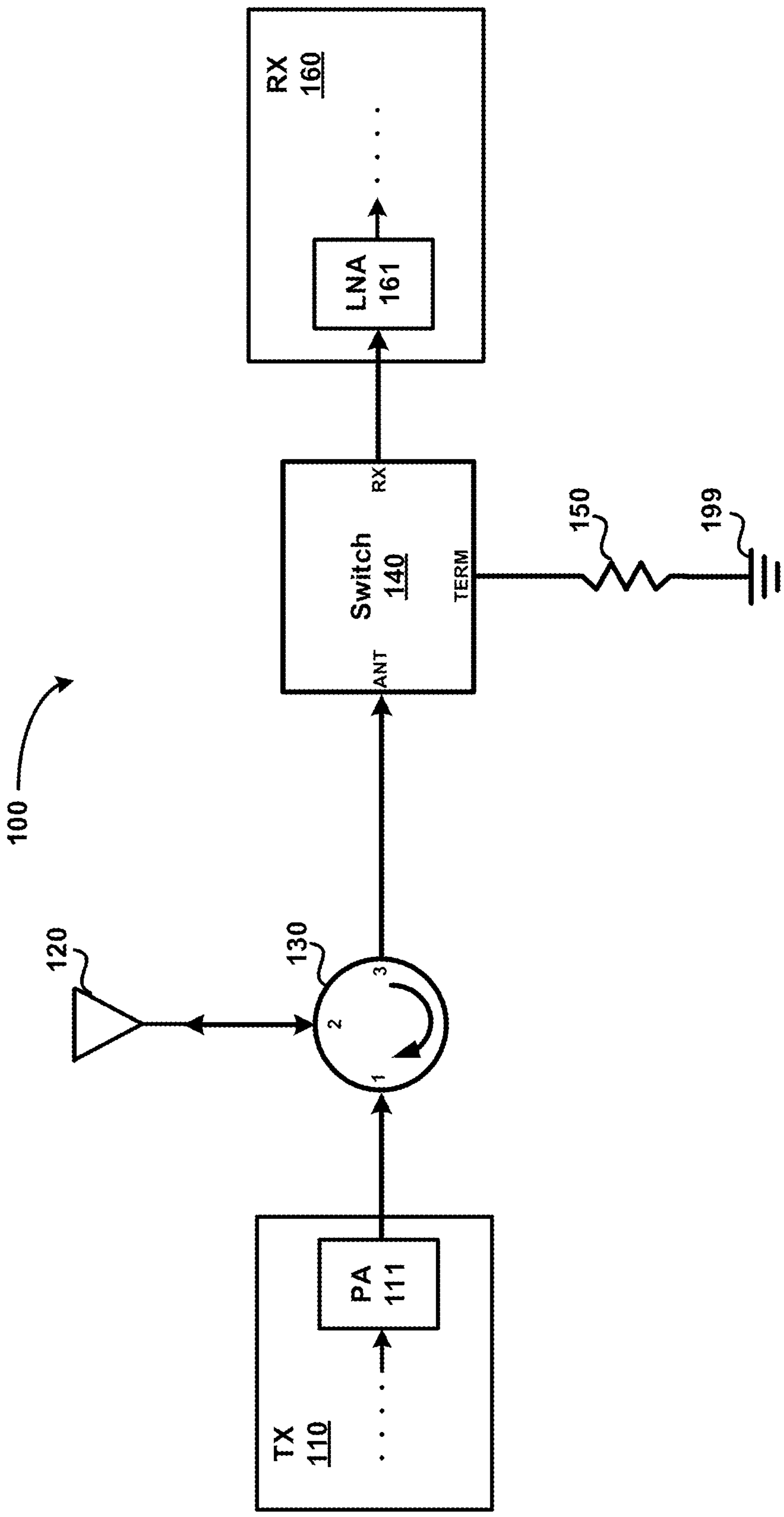
FIG. 1 is a block diagram of an example device in which a resonant switch implemented according to several aspects of the present disclosure can be used.

FIG. 1 is a block diagram illustrating an example use-case of a resonant switch provided according several aspects of the present disclosure. The Figure shows transceiver 100, in turn containing transmitter (TX) 110, antenna 120, circulator 130, resonant switch 140, termination resistor 150 and receiver (RX) 160. Power amplifier (PA) 111 of TX 110 and low-noise amplifier (LNA) 161 of RX 160 are also shown. The details of transceiver 100 shown and described below are provided merely by way of illustration. Further, resonant switch 140 can be employed in other devices and environments as well, as would be apparent to one skilled in the relevant arts upon reading the disclosure herein. Terminal 199 represents a ground terminal.

Circulator 130 is shown as a 3-port device. The ports are marked by numerals 1, 2 and 3 in FIG. 1. As is well known in the relevant arts, an input signal received at a port of a circulator exits only at the next port. The arrow (135) shown within circulator 130 indicates the sense in which a 'next port' is specified. Thus, with respect to circulator 130, a signal entering port 1 exits (only) at port 2, a signal entering port 2 exits (only) at port 3 and a signal entering port 3 (only)

exits at port 1. Port 1 is shown connected to output of PA 111, port 2 to antenna 120 and port 3 to the ANT port of resonant switch (switch) 140.

TX 110 may contain several other blocks internally (which are not shown) in addition to PA 111. The corresponding blocks generate information (in analog or digital form), which is modulated on one or more carrier waves. PA 111 amplifies the modulated carriers and provides the amplified signal at port 1 of circulator. The information may originate from a storage block in TX 110, or in an external device/system or from a user input, which may provide the information to TX 110 via suitable input terminals (not shown).

Antenna 120 transmits signals received via port 2 from TX 110 on a wireless medium. Antenna 120 receives signals (including information-modulated carrier signals from other transceivers/transmitters) from the wireless medium and provides the received signals on port 2 of circulator 130, with the received signals exiting on port 3 of circulator 130. Antenna 120 may be implemented based on the specific details of the frequency-bands to be supported by TX 110 and RX 160 and other technical considerations specific to the environment of operation, etc.

In an embodiment of the present disclosure, the frequency bands of 'transmit signals' (received from TX 110) and 'receive signals' (passed on to RX 160) overlap at least partially, such that transceiver 100 operates in a time-division-multiplexed (TDM) fashion. Thus, 'transmit intervals' and 'receive intervals' are multiplexed in time in the embodiment. However, it is to be understood that the use of switch 140 is not limited to TDM environments. As an example, switch 140 can be used in frequency-division multiplexed (FDM) environments in which 'transmit signals' and 'receive signals' occupy non-overlapping frequency bands, but the guard band separating the 'transmit band' and 'receive band' is very narrow and inexpensive filters are used for filtering the 'transmit signals' and 'receive signals', and TDM is also additionally employed.

Switch 140 is shown having three ports named ANT, TERM and RX. The ANT port is connected to port 3 of circulator, the TERM port is connected to a termination element, namely resistor 150, the RX port is connected to LNA 161 of RX 160. Resistor 150 is implemented to have a resistance substantially equal to the resistance of the path (transmission line) from antenna 120 to the TERM port via port 3 of circulator 130 and ANT port of switch 140. Switch 140 operates to connect the ANT port to the TERM port during transmit intervals, and the ANT port to the RX port in receive intervals.

In transmit intervals, reflections of transmit signals (from PA 111) may occur from antenna 120 due, for example, to mismatches between impedances of the transmit path from PA 111 to antenna 120 (via ports 1 and 2 of circulator 130) and the antenna input impedance. The reflected signals travel to ANT port of switch 140 via port 3 of circulator 130. In transmit intervals, switch 140 operates (for example, based on a switch control signal, not shown, but which can be provided by a suitable circuit block in transceiver 100 or a larger system in which the blocks of FIG. 1 are implemented, to connect ANT port to TERM port, thereby causing the reflected signals to be dissipated in termination resistor 150. The resistance of resistor 150 may be matched to the resistance of the path from antenna 120 to the TERM port (via port 3 and ANT port) to prevent any reflections back from resistor 150.

In receive intervals, switch 140 operates to connect ANT port to RX port, thereby passing received signals from antenna 120 to RX 160.

LNA 161 of RX 160 receives input signals from the wireless medium via antenna 120 and circulator 130, and operates to amplify the received signals. RX 160 may contain several other blocks internally (not shown) in addition to LNA 161. Together, such blocks operate to demodulate the amplified signals generated by LNA 161 to extract the information content (in analog or digital form). RX 160 may store the information in a storage block within RX 160 or provide the information to an external device/system or user.

Switch 140 generally needs to be implemented such that noise (e.g., in the form of thermal noise) generated by termination resistor 150 does not couple to RX port and thereby into LNA 161 and thus RX 160—or at least couples only minimally—at least during the receive intervals. That is, good isolation is a general requirement between the TERM port and RX port during receive intervals. Limited isolation between TERM port and RX port in receive intervals may cause the noise figure of LNA 161 to degrade (increase) due to the noise contributed by termination resistor 150, thereby degrading the performance of RX 160. As is well known in the relevant arts, Noise Figure is a measure of how much the Signal-to-Noise ratio of an input signal has degraded after going through an amplifier (such as LNA 161) and in general a receiver. It is generally desirable that the Noise Figure be as low as possible.

Another general requirement is zero or minimal insertion-loss due to switch 140 between ANT port and TERM port in transmit intervals.

A resonant switch (such as switch 140) implemented according to several aspects of the present disclosure has good isolation between its TERM port and RX port, and low insertion-loss between ANT port and TERM port. The implementation as well as operation of a resonant switch in embodiments of the present disclosure will be clearer in comparison with a prior implementation and operation of a resonant switch designed to operate as described above.

3. Prior Switch

Figure 2:
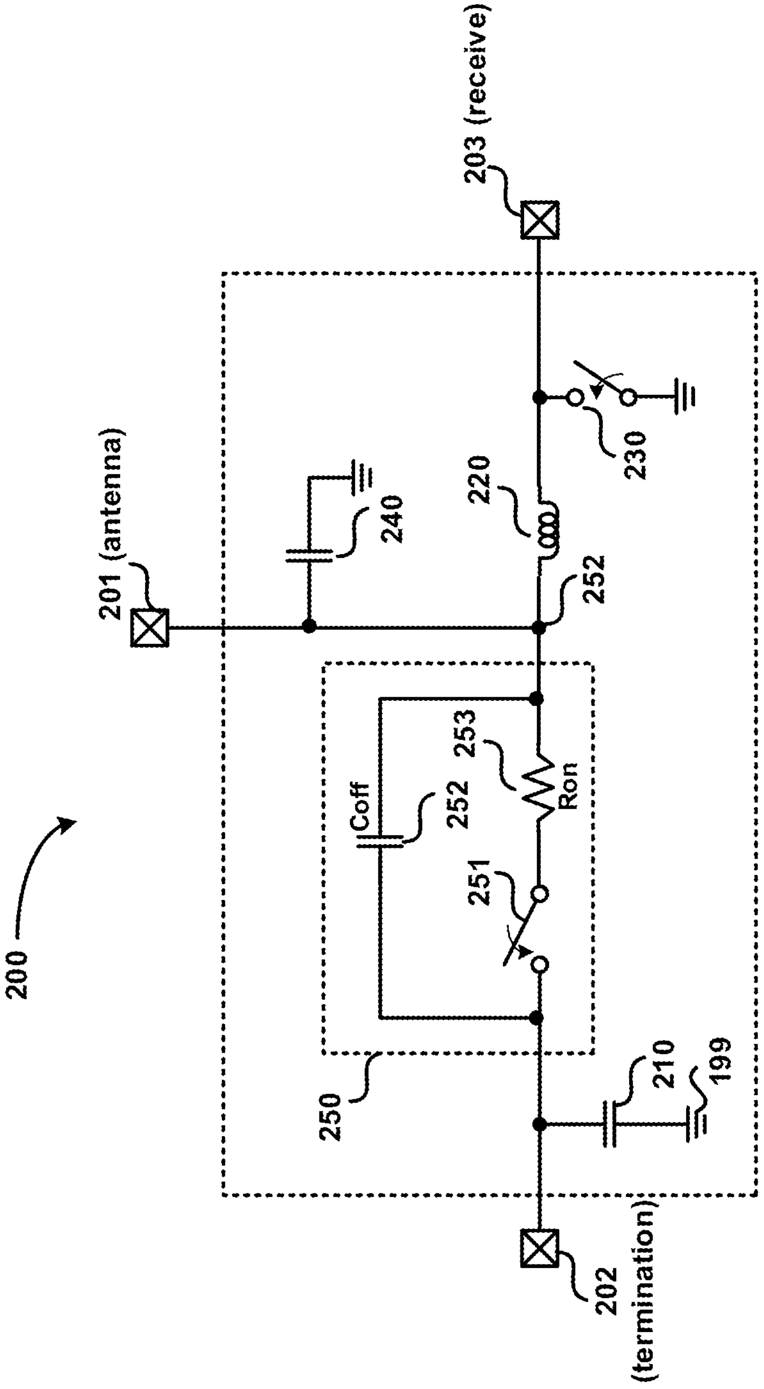
FIG. 2 (Prior Art)
FIG. 2 is a diagram illustrating a prior implementation of a resonant switch.

FIG. 2 is a diagram showing the details of a prior resonant switch 200, which is shown containing capacitors 210 and 240, switching elements 250 and 230 and inductor 220. Switching elements 250 and 230 are implemented as metal-oxide semiconductor field-effect transistors (MOSFET), although other types of transistor-types can be used. Switching element 250 is shown containing an ideal 'switching component' 251 in series with a resistor 253, and a capacitor 252 across the two terminals. Switching component 251 represents an ideal MOSFET. Resistance 253 (Ron) represents the resistance of the MOSFET (transistor in general) when in the ON-state. capacitor 252 (Coff) represents a parasitic capacitance across MOSFET 251. Ron may be zero or non-zero in magnitude.

Switching element 250 is shown connected to inductor 220 at node 252. Ports 201, 202 and 203 respectively corresponding to ANT, TERM and RX ports of FIG. 1. Switching element 230 is shown as a simple switch, although it may contain parasitic capacitance across it (similar to Coff), and have a non-zero ON-resistance (such as Ron). For the sake of ease of reference and clarity, capacitor 240 is referred to herein as Cant, capacitor 210 as Cterm, and inductor 220 as Lrx.

In transmit intervals, MOSFETS 251 and 230 are each ON (switches 251 and 230 are 'closed'). As a result, antenna port 201 (antenna) is connected to port 202 (termination), and port 203 (receive) is shorted to ground. A reflected signal from the antenna (such as in FIG. 1) flows into port 202 and is dissipated in the termination resistor (such as in FIG. 1).

In receive intervals, MOSFETS 251 and 230 are each ON (switches 251 and 230 shown in FIG. 2 are 'closed'). As a result, antenna port 201 (antenna) is connected to port 202 (termination), and port 203 (receive) is shorted to ground. A reflected signal from antenna (such as in FIG. 1) flows into port 202 and is dissipated in the termination resistor (such as in FIG. 1).

In receive intervals, MOSFETS 251 and 230 are OFF (switches 251 and 230 are 'open'). As a result, a signal received at antenna port 201 flows into the receiver via receive port 203. In transmit intervals, capacitors 210 and 240 along with inductor 220 form a parallel resonant LC network. The resonance created by such a network helps cancel the unwanted effects of components such as inductor 220 and capacitor 240 which are used in receive intervals for impedance matching/transformation. In receive intervals, in one embodiment, capacitor 240 and inductor 220 transform the input impedance of the LNA (which would be connected to receive port 203) to 50 ohms (for impedance-matching purposes) as seen from antenna port 201. Such transformation may be needed due to LNA's input impedance not being 50 ohms (or any other desired value) or because some components in the switch like transistor 230 cause the input impedance of the LNA it to be different from 50 ohms (or the desired value) as seen looking-in from the antenna port 201.

The inductance value of inductor 220 is determined as a trade-off between insertion loss due to switch 200 in transmit interval and bandwidth of the corresponding transmit signal path in switch 200 in transmit intervals and noise-figure of receiver connected to port 203. With inductor 220 so chosen, capacitance of Cant (capacitor 240) is determined such that the combination of Cant and Lrx transform LNA input impedance to 50-Ohm when viewed from antenna port 201. The capacitance of Cterm is determined such that the resonant frequency due to Cant, Cterm and Lrx is centered at the center of the transmit frequency band.

Thus, the component values of Lrx and Cant are chosen based on the above-noted impedance transformation of LNA's input impedance as seen from port-3 of circulator 130 or, more generally, as seen from antenna 120 as noted above. The capacitance of capacitor Cterm is chosen to ensure that the passive network in the transmit-path from port 401 to 402 (which includes capacitor 440, inductor 450, the parasitic capacitor(s), and Cterm itself) resonates at the desired frequency in transmit intervals of operation.

It is noted here that, typically, rather than use one switching element 250, a series connection of multiple ones of such switching elements (all identical to each other or different in terms of ON-resistance and OFF-capacitance) forming a switching-element stack may be used in place of switching element 250 in switch 200 to allow switch 200 to withstand higher breakdown voltages and therefore to operate with higher signal voltages, as is well known.

Figure 3:
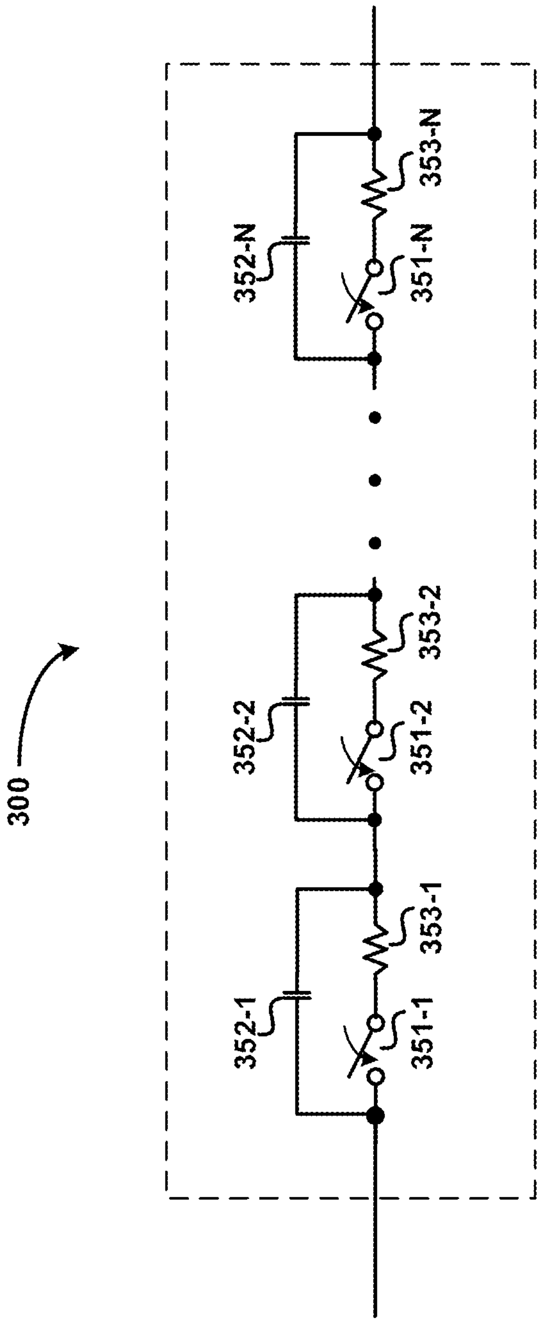
FIG. 3 is a diagram illustrating a switch stack.

An example switching-element 'stack' (switch stack) is shown in FIG. 3. Stack 300 is shown containing 'N' individual MOSFETS (switching elements). Each MOSFET is shown as an ideal switch in series with a resistor (representing ON resistance) and in parallel with a capacitor (representing the OFF capacitance), similar to switching element 250 of FIG. 2. Thus, ideal switches 351-1 to 351-N, resistors 353-1 to 353-N and capacitors 352-1 to 352-N are shown in FIG. 3.

Prior switch 200, whether used with one switching element (e.g., 250) or multiple series-connected switching elements (such as stack 300 of FIG. 3) in place of switching element 250 contains capacitor 210 connected between nodes 202 and ground 199. Prior switch 200 may suffer from several drawbacks. As shown in FIG. 2, switching element 250 is implemented using MOSFET 251, which is not an ideal switch. MOSFET 251 has an ON-resistance (Ron) 253 when switched ON, and an OFF-capacitance Coff. The ON-resistance (Ron) contributes to insertion-loss (IL) in transmit intervals. A higher insertion-loss means higher power dissipation on-chip (i.e., within switch 200 in integrated circuit (IC) form or when switch 200 is part of another IC (for example RX 160 of FIG. 1) which the IC die may not be designed to handle and which can cause malfunction of the switch.

In receive intervals, the off-capacitance (Coff) degrades the isolation between termination port 202 and receive port 203. That is, Coff provides a path for noise in the termination resistor (that would be connected between node 202 and ground) to couple into the receiver (that would be connected to node 203). As a result, the noise figure of LNA/receiver is degraded. The drawbacks may become worse when the size of each series-connected switching elements is increased to reduce insertion loss, since larger size would cause the parasitic capacitance across each switching element to become larger.

Some possible techniques to improve isolation between ports 202 and 203 by reducing the effective parasitic OFF capacitance across the switching element(s) can be achieved by reducing the width of each MOSFET and/or increasing the number of series-connected switching elements without increasing the unit-size of each MOSFET. However, both these approaches will result in a higher insertion-loss, which is undesirable.

A resonant switch implemented according to aspects of the present disclosure overcomes one or more of the drawbacks noted above, and is described next.

4. Resonant Switch

Figure 4:
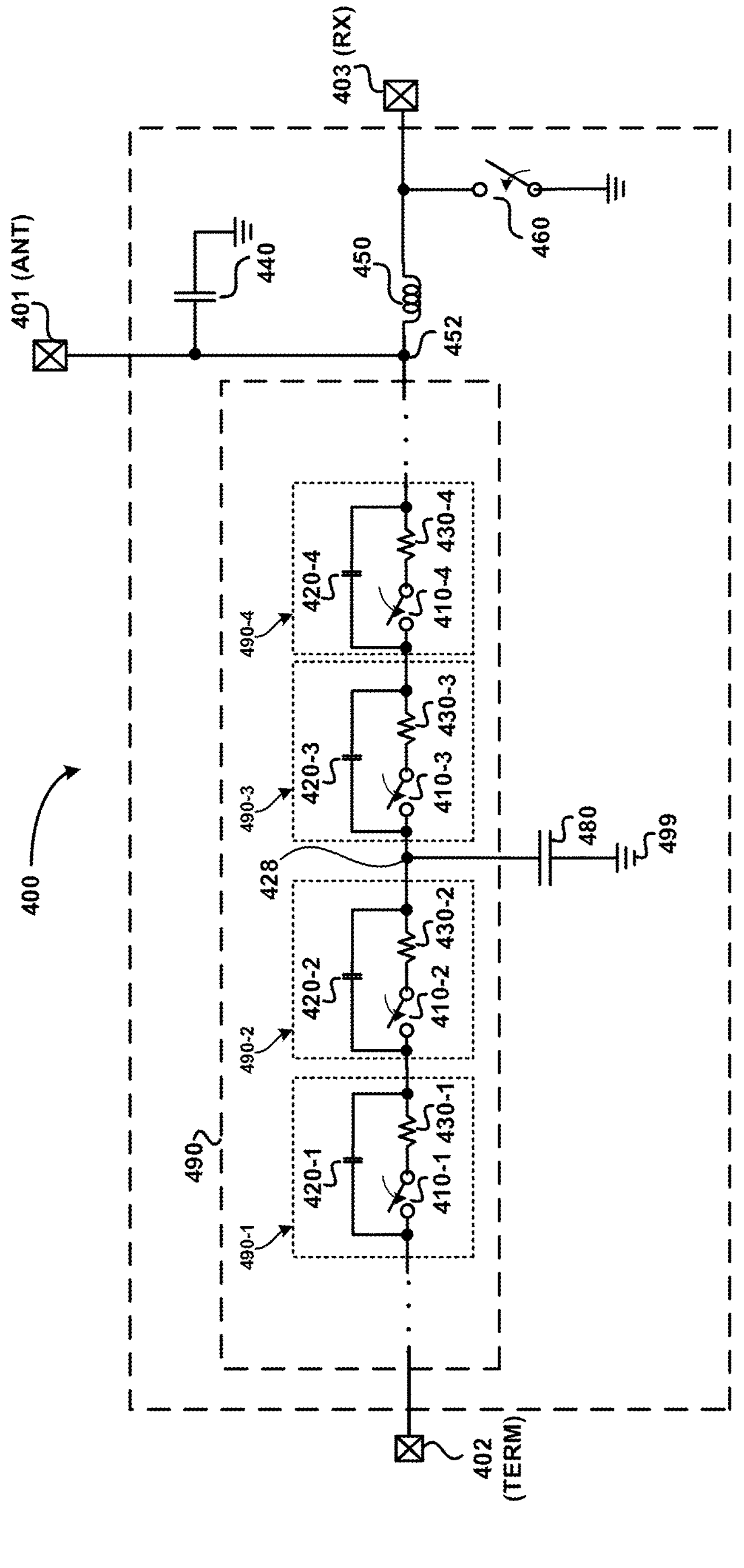
FIG. 4 is a diagram illustrating the implementation details of a resonant switch in an embodiment of the present disclosure.

FIG. 4 is a diagram of a resonant switch provided according to several aspects of the present disclosure. Resonant switch 400 is shown containing capacitors 440 and 480, switch stack 490, switching element 460 and inductor 450. Node 499 represents a ground terminal. When used in place of switch 140 in transceiver 100 (FIG. 1), node 499 is the same as (or is tied to) ground node 199 there.

Inductor 450 and capacitors 440 and 480 correspond respectively to inductor 220 and capacitors 210 and 240 of FIG. 2. Switch stack 490 is used in place of switching element 250 of FIG. 2. The ON-state resistance of a switching element in stack 490 may be zero or non-zero. Switching element 460 corresponds to switching element 230 of FIG. 2. Ports 401 (ANT), 402 (TERM) and 403 (RX) respectively correspond to ports 210, 202 and 203 of FIG. 2. Node 452 represents the junction of stack 490 and inductor 450. Although a single switching element 460 is shown connected between port 403 and ground, a switch stack (with multiple switching elements in series) can be used in its place to accommodate larger signals, as would be apparent to one skilled in the relevant arts.

With combined reference to FIGS. 1 and 4, when used in place of switch 140 of FIG. 1, port 402 would be connected to a ground terminal via termination resistor 150 (FIG. 1), port 401 would be connected to port 3 of circulator 130, and port 403 would be connected to LNA 161 of RX 160.

Switch stack 490 is shown containing four switching elements 490-1, 490-2, 490-3 and 490-4. Each switching element may be similar to the switching elements shown in FIGS. 2 and 3, and is represented by an ideal switch in series with a resistor, and in parallel with a capacitor. The resistor represents the ON resistance of the switching element. The capacitor represents the parasitic capacitance across the element when the element is in the OFF state. The switching element may be implemented using any type of semiconductor technology. In an embodiment, each switching element of stack 490 as well as switching element 460 is implemented as a MOSFET. However, in other embodiments, other types of transistors or switching elements can also be used which would be similar to a MOSFET (or at least having a parasitic capacitance across the two switch-terminals. Such similar types of devices can have a zero or non-zero ON-state resistance. For each of the four switching elements shown in FIG. 4, the ideal switches of each are indicated by 410-1 to 410-4, the ON-state resistance by 430-1 to 430-4, and the OFF-state capacitance by 420-1 to 420-4.

Although switch stack 490 is shown as having only four switching elements, stack 490 can also have more or fewer switching elements. The specific number of switching elements would typically be determined by consideration such as signal levels, breakdown voltages, etc., as is well known in the relevant arts. Further, the multiple switching elements may all be identical to each other or different in terms of characteristics such as, for example, transistor-size, ON-resistance, parasitic OFF-capacitance, etc. The control signal (e.g., gate drive signal for the MOSFETs in a stack) may be provided by an external component/block such as RX 160 (FIG. 1, when used in place of switch 140).

In transmit intervals, switching element 460 as well as all the elements of stack 490 are closed (i.e., the corresponding transistors are ON), and the reflected signal from the antenna (such as in FIG. 1) flows into port 402 and is dissipated in the termination resistor (such as in FIG. 1). In receive intervals, switching element 460 as well as all the elements of stack 490 are open (i.e., the corresponding transistors are OFF). As a result, a signal received at antenna port 401 flows into the receiver via port 403.

Similar to as with prior switch 200, in transmit intervals, capacitors 440 and 480 along with inductor 460 form a parallel resonant LC (inductor-capacitor) network. In receive intervals, capacitor 440 and inductor 450 transform the input impedance of the LNA (which would be connected to receive port 403) to 50 ohms (for impedance-matching purposes) as seen from antenna port 401. The magnitudes of capacitances of capacitors 440 and 480, and inductor 450 may be determined in a manner similar to that described above with respect to capacitors 240 and 210 and inductor 220 of FIG. 2, and the description is not repeated here in the interest of conciseness.

According to an aspect of the present disclosure, capacitor 480 rather than being connected between the termination port 402 and ground, is instead connected between a node at a junction of a pair of switching elements in switch stack 490 and ground. In an embodiment, capacitor 480 is connected between the mid-point of the stack and ground. Assuming switch stack 490 has only four switching elements as shown in FIG. 4, the mid-point (e.g., node 428—the 'mid-point junction') would have an equal number of switching elements on either side. However, in alternative embodiments, capacitor 480 can be connected to a node in stack 490 with unequal number of switching elements on either side. The other end of capacitor 480 is connected to ground.

Various advantages offered by switch 400 and further improvements are briefly noted next.

5. Advantages and Further Improvements

When used in place of switch 140 in transceiver 100 (FIG. 1), resonant switch 400 provides greater isolation between ports 402 and 403 in receive intervals, and reduced insertion-loss in transmit intervals.

Denoting 'Ceff-prior' as the effective OFF-state capacitance between nodes 402 and 452 (FIG. 4) had capacitor 480 been connected between node 402 and ground (as in prior switch of FIG. 2), with capacitor 480 being instead connected between node 428 and ground the effective capacitance 'Ceff' between nodes 402 and 452 is specified by the following equation:

$$Ceff = Ceff\text{-prior}/[1+(0.25*(C480/Ceff\text{-prior}))] \quad \text{Equation 1}$$

wherein,

Ceff is the effective capacitance between nodes 402 and 452,

'/' represents a 'divide' operation,

'*' represents a multiply operation, and

C480 is the capacitance of termination capacitor 480.

Equation 1 assumes that there are an equal number of switching elements on either side of capacitor 480. The reduction in the effective capacitance is due to the T-attenuator network formed by the parasitic OFF-capacitances 420 and capacitor 480. It may be observed that Ceff is lower than Ceff-prior by the factor [1+(0.25*(C480/Ceff-prior))]. Larger the ratio C480/Ceff-prior, lower is the effective capacitance Ceff. The smaller effective capacitance increases the isolation between ports 402 and 403, thereby resulting in a reduction in the noise-power that would couple from the termination resistor into LNA 161 and RX 160.

In transmit intervals, had capacitor 480 been connected between node 402 and ground (as in prior switch of FIG. 2), the portion of the reflected current that would flow into capacitor 480 would also flow through all the switching elements of switch 490. By connecting capacitor 480 instead to a junction of two switching elements (e.g., in middle of the stack such as node 428), the above-noted portion of the reflected current would not flow through the switching elements to the left of the junction (e.g., 428). As a result, IR losses (power loss in resistors) through switch stack 490 would be reduced to that extent, and the insertion-loss is smaller. Thus, moving capacitor 480 from port 402 to a junction of a pair of switching elements of switch stack 490 provides the benefits of improved isolation and reduced insertion-loss.

Based for example on objectives of the design and/or the operating environment, the optimal connection-point of capacitor 480 to stack 490 can be a switching-element-junction located either to the right of or to the left of the mid-point-junction. For example, if reducing insertion-loss and limiting the reflected current's flow through switch stack 490 is desired, capacitor 480 may be connection to the junction of the rightmost pair of switches.

For a given number of switching elements in stack 490, the effective capacitance 'Ceff' between nodes 402 and 452 depends on the junction to which capacitor 480 is connected, and is specified by the following Equation:

$$Ceff=(Cp/N)*1/[1+(n*(1-n/N)*C480)] \quad \text{Equation 2}$$

wherein,

Cp is the OFF-capacitance of each switching element in stack 490,

'N' is the number of switching elements in stack 480,

'n' represents the switching-element-junction, counted from left to right in stack 490, to which capacitor 480 is connected, and C480 represents the capacitance of capacitor 480.

It may be observed from Equation 2 that when/if C480 equals 0, then Ceff equals Cp/N. Also, when 'n' is 0 or 'N', then too Ceff equals Cp/N. The effective capacitance Ceff is a minimum for n=N/2. Ceff also scales (changes proportionally) with the manufacturing technology or process, usually termed 'process node' (e.g., 25 nanometer process), usually specified in terms of the dimensions of the smallest feature (e.g., the channel width of a transistor) that can be fabricated using that manufacturing technology/process. The finer (smaller features) the process node, smaller would be the magnitude of 'Ceff'. Hence, for the same value of C480, the isolation between nodes 402 and 452 would increase as the process node becomes finer.

To obtain further improvements, since techniques described above enable reduction of the current in the section of the switch stack to the left (as viewed in FIG. 4) of the junction to which capacitor 480 is connected, components in such a portion of the stack (i.e., those located to the left of the junction to which capacitor 480 is connected) are implemented with reduced size (such as, for example, reduced dimensions such as channel-width and channel-length of the corresponding transistors) as compared to those on the right to maintain insertion loss substantially the same as when/if capacitor 480 is connected to port 402. Additionally, such an approach would also further increase isolation (due to smaller OFF-capacitances to the left of the junction to which capacitor 480 is connected) and reduce implementation area for switch 400.

Further, the improvements noted above can be combined with traditional approaches to increasing isolation such as by reducing the size of each switching element and/or by increasing the stack height, i.e., the number of switching elements in series in the stack. It may be appreciated that when capacitor 480 is connected to a switching-element-junction in stack 490 as described above, the factor by which the size/dimension of each switching element needs to reduced or the stack height needs to be increased to improve isolation would be lower than if capacitor 480 were to be connected to port 402. More generally, capacitor 480 can be connected at any available node, i.e., at either end nodes of stack 490 or at any junction of a pair of switching elements of stack 490. If capacitor 480 were connected at the leftmost node (i.e., at TERM port 402 in FIG. 4), both the isolation and insertion loss are poor. As the capacitor 480's connection point in stack 490 is moved from the left towards the right in the stack (the sense of 'left' and 'right' being as viewed in FIG. 4), both isolation and insertion loss keep improving. When the connection point is at the middle of the stack, the isolation is maximum. Moving the connection point further towards the right degrades isolation relative to the maximum but improves insertion loss. The insertion loss is least when the connection point is node 452.

6. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 2, 3 and 4, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals. In the instant application, the power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A resonant switch having a first port, a second port and a third port, said resonant switch comprising:

a plurality of switching elements coupled in series between said first port and said second port, with each switching element having a resistance in the ON-state and having a parasitic capacitance across, wherein all of said plurality of switching elements are turned ON to provide a first connection path between said first port and said second port to pass an input signal from said first port to said second port in each of a first set of time intervals, wherein at least some of said plurality of switching elements are turned OFF to disconnect said first connection path in each of a second set of time intervals, said plurality of switching elements comprising a first set of switching elements and a second set of switching elements, each of said first set of switching elements and second set of switching elements also being coupled as a corresponding series, said first set of switching elements and said second set of switching elements being connected at a junction; and a first capacitor having a first capacitance and being coupled between said junction and a constant reference potential, wherein said first capacitor is provided as a sole capacitor between said first connection path and said constant reference potential, wherein capacitance between said junction and said constant reference potential equals said first capacitance in both of said first set of time intervals and said second set of time intervals.

2. The resonant switch of claim 1, wherein said junction is selected such that effective capacitance between said first port and said second port is least compared to any other position for said junction, said resonant switch further comprising:

an inductor between said first port and said third port; and a shunt switch between said third port and said constant reference potential, wherein said shunt switch is closed in said first time interval to isolate said third port from said first connection path in said first time interval, and is opened in said second time interval.

3. The resonant switch of claim 2, wherein a number of switching elements in said first set of switching elements equals that in said second set of switching elements, wherein said plurality of switching elements comprise at least three switching elements.

4. The resonant switch of claim 2, wherein one end of said first set of switching elements is coupled to said second port, the other end of said first set of switching elements being coupled to said junction, wherein one end of said second set of switching elements is coupled to said junction, the other end of said second set of switching elements being coupled to said first port, said resonant switch further comprising:

a second capacitor coupled between said first port and said constant reference potential, wherein said input signal flowing from said first port to said second port in each of said first set of time intervals has a bandwidth that lies within a band of interest, wherein values of said first capacitance, capacitance of said second capacitor, and inductance of said inductor are designed to have values such that a parallel LC resonant circuit by said first capacitor, said second capacitor and said inductor exhibits a resonance within said band of interest in each interval of said first set of time intervals.

5. The resonant switch of claim 4, wherein, in said second set of time intervals, an input signal received at said first port flows to said third port.

6. The resonant switch of claim 5, wherein coupling of said first capacitor between said junction and said constant reference potential enables greater isolation between said second port and said third port in said second set of time intervals as well as lower insertion-loss between said first port and said second port in said first set of time intervals than if said first capacitor is coupled between said second port and said constant reference potential.

7. The resonant switch of claim 5, wherein said magnitudes of said capacitance of said second capacitor and said inductance of said inductor also cause an impedance at said third port to be transformed when seen from said first port.

8. The resonant switch of claim 4, wherein each of said plurality of switching elements is a metal oxide semiconductor field effect transistor (MOSFET).

9. The resonant switch of claim 4, wherein dimensions of switching elements in said first set of switching elements are smaller than dimensions of switching elements in said second set of switching elements.

10. The resonant switch of claim 1, wherein said plurality of switching elements are comprised in a switch stack, wherein said junction is a connection point of two switching elements closest to said first port in said first connection path, wherein said two switching elements are comprised in said plurality of switching elements.

11. A transceiver comprising:

a resonant switch comprising a first port, a second port and a third port;

a transmitter to generate a first signal;

a receiver to process a second signal;

an antenna to transmit said first signal on a wireless medium, said antenna to receive said second signal from said wireless medium;

a circulator comprising a fourth port coupled to said transmitter, a fifth port coupled to said antenna and a sixth port coupled to said first port of said resonant switch, said circulator to receive said first signal from said transmitter on said fourth port and to forward said first signal to said antenna on said fifth port, said circulator to receive said second signal from said antenna on said fifth port and to forward said second signal to said first port of said resonant switch on said sixth port, wherein said second port of said resonant switch is coupled to a constant reference potential via a termination resistor, and wherein said third port of said resonant switch is coupled to said receiver, wherein said resonant switch comprises:

a plurality of switching elements coupled in series between said first port and said second port, with each switching element having a resistance in the ON-state and having a parasitic capacitance across, wherein all of said plurality of switching elements are turned ON to provide a first connection path between said first port and said second port to pass an input signal from said first port to said second port in each of a first set of time intervals, wherein at least some of said plurality of switching elements are turned OFF to disconnect said first connection path in each of a second set of time intervals, said plurality of switching elements comprising a first set of switching elements and a second set of switching elements, each of said first set of switching elements and second set of switching elements also being coupled as a corresponding series, said first set of switching elements and said second set of switching elements being connected at a junction; and a first capacitor having a first capacitance and being coupled between said junction and said constant reference potential, wherein said first capacitor is provided as a sole capacitor between said first connection path and said constant reference potential, wherein capacitance between said junction and said constant reference potential equals said first capacitance in both of said first set of time intervals and said second set of time intervals.

12. The transceiver of claim 11, wherein said junction is selected such that effective capacitance between said first port and said second port is least compared to any other position for said junction, said resonant switch further comprising:

an inductor between said first port and said third port; and a shunt switch between said third port and said constant reference potential, wherein said shunt switch is closed in said first time interval to isolate said third port from said first connection path in said first time interval, and is opened in said second time interval.

13. The transceiver of claim 12, wherein a number of switching elements in said first set of switching elements equals that in said second set of switching elements, wherein said plurality of switching elements comprise at least three switching elements.

14. The transceiver of claim 12, wherein one end of said first set of switching elements is coupled to said second port, the other end of said first set of switching elements being coupled to said junction, wherein one end of said second set of switching elements is coupled to said junction, the other end of said second set of switching elements being coupled to said first port, said resonant switch further comprising:

a second capacitor coupled between said first port and said constant reference potential, wherein said input signal flowing from said first port to said second port in each of said first set of time intervals has a bandwidth that lies within a band of interest, wherein values of said first capacitance, capacitance of said second capacitor, and inductance of said inductor are designed to have values such that a parallel LC resonant circuit formed by said first capacitor, said second capacitor and said inductor has a peak resonance within said band of interest in each interval of said first set of time intervals.

15. The transceiver of claim 14, wherein, in said second set of time intervals, an input signal received at said first port flows to said third port.

16. The transceiver of claim 15, wherein coupling of said first capacitor between said junction and said constant reference potential enables greater isolation between said second port and said third port in said second set of time intervals as well as lower insertion-loss between said first port and said second port in said first set of time intervals than if said first capacitor is coupled between said second port and said constant reference potential.

17. The transceiver of claim 15, wherein said magnitudes of said capacitance of said second capacitor and said inductance of said inductor also cause an impedance at said third port to be transformed when seen from said first port.

18. The transceiver of claim 14, wherein each of said plurality of switching elements is a metal oxide semiconductor field effect transistor (MOSFET).

19. The transceiver of claim 14, wherein dimensions of switching elements in said first set of switching elements are smaller than dimensions of switching elements in said second set of switching elements.

20. The transceiver of claim 11, wherein said plurality of switching elements are comprised in a switch stack, wherein said junction is a connection point of two switching elements closest to said first port in said first connection path, wherein said two switching elements are comprised in said plurality of switching elements.

* * * * *